United States Patent
Boggs et al.

(10) Patent No.: US 9,614,383 B2
(45) Date of Patent: Apr. 4, 2017

(54) SELF-DISCHARGE FOR HIGH VOLTAGE BATTERY PACKS

(71) Applicant: Tesla Motors, Inc., Palo Alto, CA (US)

(72) Inventors: Brian Stuart Boggs, Menlo Park, CA (US); Joseph Michael Darragh, San Francisco, CA (US); Anil Paryani, Cerritos, CA (US); Chuen Chou, Mountain View, CA (US)

(73) Assignee: Tesla Motors, Inc., Palo Alto ( * ) Notice: Subject to any disclaimer, the term of this patent is extended or adjusted under 35 U.S.C. 154(b) by 796 days.

(21) Appl. No.: 13/784,542

(22) Filed: Mar. 4, 2013

(65) Prior Publication Data

US 2013/0307480 A1 Nov. 21, 2013

Related U.S. Application Data

(60) Provisional application No. 61/649,293, filed on May 19, 2012, provisional application No. 61/662,913, filed on Jun. 21, 2012.

(51) Int. Cl.
| | | |
|---|---|---|
| *H02J 7/00* | (2006.01) | |
| *B60L 3/00* | (2006.01) | |
| *B60L 11/18* | (2006.01) | |
| *G01R 31/36* | (2006.01) | |

(52) U.S. Cl.
CPC .............. *H02J 7/0029* (2013.01); *B60L 3/00* (2013.01); *B60L 3/0046* (2013.01); *H02J 7/007* (2013.01); *H02J 7/0042* (2013.01); *B60L 11/1816* (2013.01); *B60L 11/1818* (2013.01); *B60L 11/1838* (2013.01); *G01R 31/36* (2013.01)

(58) Field of Classification Search
CPC ........ H02J 7/0029; H02J 7/0042; H02J 7/007; B60L 3/0046; B60L 3/00; B60L 11/1816; B60L 11/1818; B60L 11/1838; G01R 31/36

USPC ................ 320/118, 127, 135, 136
See application file for complete search history.

(56) References Cited

U.S. PATENT DOCUMENTS

| | | | |
|---|---|---|---|
| 6,388,426 B1 * | 5/2002 | Yokoo ................ | G01R 31/3648 320/136 |
| 2009/0023053 A1 | 1/2009 | Berdichevsky et al. | |
| 2010/0075213 A1 | 3/2010 | Mehta et al. | |
| 2010/0136391 A1 | 6/2010 | Prilutsky et al. | |
| 2010/0136413 A1 | 6/2010 | Hermann et al. | |
| 2010/0138178 A1 | 6/2010 | Paryani et al. | |
| 2010/0273034 A1 | 10/2010 | Hermann et al. | |
| 2011/0174556 A1 | 7/2011 | Hermann et al. | |
| 2012/0013341 A1 | 1/2012 | Hermann et al. | |

(Continued)

FOREIGN PATENT DOCUMENTS

| | | |
|---|---|---|
| EP | 2330661 A1 | 6/2011 |
| WO | WO 2011/142373 A1 | 11/2011 |

OTHER PUBLICATIONS

Xing, Yinjiao, et al., "Battery Management Systems in Electric and Hybrid Vehicles", Energies 2011, No. 4, pp. 1840-1857.

*Primary Examiner* — Nathaniel Pelton
(74) *Attorney, Agent, or Firm* — Garlick & Markison; Bruce E. Garlick

(57) ABSTRACT

A system and method for providing energy management and maintenance of a high energy battery pack through use self-discharge features and processes. A battery pack is configured with self-discharger enabled-components that selectively discharge energy from the battery pack without the battery pack providing operational power.

20 Claims, 7 Drawing Sheets

(56) References Cited

U.S. PATENT DOCUMENTS

| | | |
|---|---|---|
| 2012/0034497 A1 | 2/2012 | Hermann et al. |
| 2012/0041628 A1 | 2/2012 | Hermann et al. |
| 2012/0105001 A1* | 5/2012 | Gallegos ............... B60L 3/0046 320/109 |
| 2012/0111444 A1 | 5/2012 | Hermann et al. |
| 2012/0111445 A1 | 5/2012 | Hermann |
| 2012/0153901 A1 | 6/2012 | Hermann et al. |
| 2012/0161708 A1* | 6/2012 | Miura et al. .................. 320/118 |
| 2013/0106362 A1* | 5/2013 | Mackintosh et al. ......... 320/136 |
| 2013/0169235 A1* | 7/2013 | Patino et al. ................. 320/136 |
| 2013/0175999 A1* | 7/2013 | Thieme .................... B60L 3/04 320/136 |
| 2013/0179012 A1 | 7/2013 | Hermann et al. |
| 2013/0196184 A1 | 8/2013 | Faass et al. |
| 2013/0200855 A1* | 8/2013 | Christensen et al. ......... 320/136 |

\* cited by examiner ic vehicles (EV).

SELF-DISCHARGE FOR HIGH VOLTAGE BATTERY PACKS

CROSS REFERENCE TO RELATED APPLICATIONS

This application claims benefit of U.S. Patent Application No. 61/649,293 filed 19 May 2012 and of U.S. Patent Application No. 61/662,913 filed 21 Jun. 2012, the contents of which are expressly incorporated in their entireties by reference thereto for all purposes. This application is related to U.S. patent application Ser. No. 13/784,437 entitled "METHOD AND SYSTEM FOR SERVICING HIGH-VOLTAGE BATTERY PACKS" filed concurrently herewith and is related to U.S. patent application Ser. No. 13/784,458 entitled "SECONDARY SERVICE PORT FOR HIGH VOLTAGE BATTERY PACKS" filed concurrently herewith, the contents of both are hereby expressly incorporated in their entireties by reference thereto for all purposes.

FIELD OF THE INVENTION

The present invention relates generally to charging and discharging energy storage systems, and more specifically, but not exclusively, to energy maintenance and management of a self-discharge of high-voltage battery packs useable in electric vehicles (EV).

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Battery packs used with electric vehicles store large amounts of energy in a small space, producing high energy densities. These battery packs include an external housing that is designed for more than just environmental protection and packaging efficiency. The housing also enhances safety and stability, particularly under a range of anticipated abnormal operating conditions.

Due to the high energy densities involved, it is known to provide internal safety mechanisms to help ensure that stored energy is controllably released under a narrow set of circumstances. These safety mechanisms interact with mechanical and electrical interfaces provided by an operational vehicle to enable energy charging and discharging.

There are a wide range of situations where energy maintenance and management of a battery pack is needed, and not all of these include situations where the battery pack is installed in a vehicle or a vehicle known to be 100% operational. Some of these situations include storage, transport, and recycling of a high energy battery pack where the battery pack is not installed in an EV. Other situations include operations on a battery pack that is installed in an EV, but the circumstances indicate that operation of the EV, or a subsystem thereof, may be degraded. Degradation may occur from collisions or acts of nature and could compromise a safety system of the battery pack. Even when the safety system is not actually compromised, the state of the vehicle or its environment or status may indicate that there is a risk that the safety system has been compromised. In those situations, it may not be reasonable to expect that the vehicle may be available to provide the necessary interface and safety structures. Of course, there are also situations where maintenance and management operations are needed with respect to a fully functional EV and battery pack.

Maintenance and management operations include charging and discharging a battery pack safely to desired state of charge (SOC) levels. Depending upon the situation, the desired SOC level could require a discharging or a charging operation. Under some circumstances, it is necessary or desirable to perform the operation without benefit of the battery pack being installed into an EV, nor is it always economical or possible in every case to provide an operational EV into which the candidate battery pack may be installed.

One of the incorporated co-pending patent applications includes a discussion of a charging/discharging tool that advantageously under certain circumstances has access to a high-voltage battery pack through a secondary service connection. Sometimes it is the case that the primary service connection is unavailable while there is significant stranded energy present. These cases may include damage to the primary service connection, internal fault with the energy storage system, and/or damaged or defective internal connections. Sometimes it is the case that use of an external discharger unit is not possible, or the external discharger unit is unavailable.

Even in situations when the primary service connection is available, use of a charging/discharging tool through this connection may add undesired costs and complexities under some scenarios. In order to operate the primary service connection typically used by an electric vehicle, the charging/discharging requires costly CAN communication, special connectors, time to disconnect the vehicle electrical connector and install the connector to the external device, and configuration/use of any simulator to emulate conditions of the operating environment in cases where there are failsafe protections inhibiting direct access by such a tool.

An energy storage system installed in an EV with significant stranded energy may be implicated by first responders (e.g., fire fighters, security, and emergency personnel) and second responders (e.g., tow truck drivers, dismantlers, junk yards, and auto-salvagers). Whether there is a need for rapid response or access by persons who may lack monetary resources, training, or technical background to address the stranded energy through the primary service connection using a specialized and sophisticated charging/discharging tool, it can be problematic when access to the energy storage system is limited.

What is needed is an apparatus and method for providing energy management and maintenance of a high energy battery pack through use self-discharge features.

BRIEF SUMMARY OF THE INVENTION

Disclosed is a system and method for providing energy management and maintenance of a high energy battery pack through use self-discharge features and processes.

The following summary of the invention is provided to facilitate an understanding of some of technical features related to energy management and maintenance of a high energy battery pack that is at least partially functional and intact, and is not intended to be a full description of the present invention. A full appreciation of the various aspects of the invention can be gained by taking the entire specification, claims, drawings, and abstract as a whole. The present invention is applicable to other operating environments in addition to the EV environment.

A self-dischargeable rechargeable high-voltage battery pack, including: a plurality of series-coupled energy storage elements; a housing enclosing and sealing the plurality of series-coupled energy storage elements with a plurality of exterior walls; an operational port coupled to a portion of a first particular one exterior wall of the plurality of exterior walls, the operational port providing an energy transfer with respect to the plurality of series-coupled energy storage elements; and a self-discharger, responsive to a self-discharge signal, initiating an internal dissipation of energy from the plurality of series-coupled energy storage elements while the self-discharge signal is asserted without the energy transfer through the operational port, wherein the internal dissipation of energy is disabled when the self-discharge signal is not asserted.

A computer-implemented method for managing a self-dischargeable rechargeable high-voltage battery pack, including: a) configuring the self-dischargeable rechargeable high-voltage battery pack for an energy transfer between the self-dischargeable rechargeable high-voltage battery pack and an exterior operational port; and b) self-discharging the self-dischargeable rechargeable high-voltage battery pack using a processor in response to an assertion of a self-discharge signal, the self-dischargeable rechargeable high-voltage battery pack not self-discharging absent the assertion and not self-charging using the energy transfer.

Embodiments include a method and system for self-discharging high-voltage battery packs when the supporting operating environment (e.g., an EV) without regard to whether it installed in an operating environment. Some embodiments provide increased discharge rates when installed in an operating environment due to improved temperature control afforded by the operating environment.

Some of the disclosed embodiments define and include initiation of an automated self-discharge in response to a collision event. Under some circumstances, self-discharge may be modulated in response to temperature information to maintain self-discharge at the highest possible safe self-discharge rate.

Any of the embodiments described herein may be used alone or together with one another in any combination. Inventions encompassed within this specification may also include embodiments that are only partially mentioned or alluded to or are not mentioned or alluded to at all in this brief summary or in the abstract. Although various embodiments of the invention may have been motivated by various deficiencies with the prior art, which may be discussed or alluded to in one or more places in the specification, the embodiments of the invention do not necessarily address any of these deficiencies. In other words, different embodiments of the invention may address different deficiencies that may be discussed in the specification. Some embodiments may only partially address some deficiencies or just one deficiency that may be discussed in the specification, and some embodiments may not address any of these deficiencies.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Figure 1:
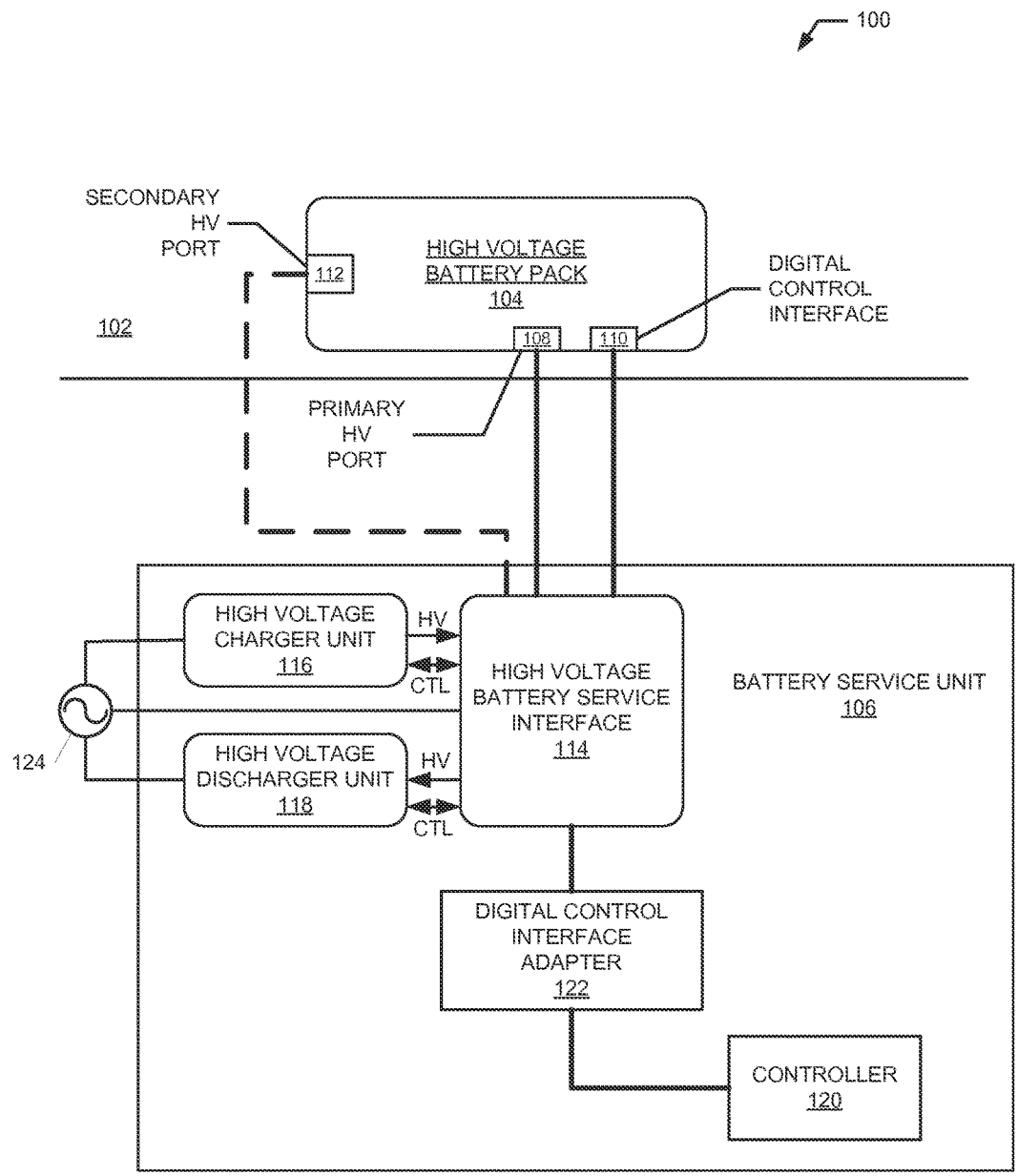
FIG. 1 is a block diagram illustrating schematically an electric vehicle having a high-voltage battery pack coupled to a battery service unit in accordance with some embodiments of the present invention.

Embodiments of the present invention provide a system and method for providing energy management and maintenance of a high energy battery pack through use self-discharge features. The following description is presented to enable one of ordinary skill in the art to make and use the invention and is provided in the context of a patent application and its requirements.

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

A battery service unit capable of simulating an operating environment of a high-voltage battery pack (e.g., simulating an EV) to enable charging and discharging of the battery pack has numerous advantages. When the battery pack is not installed in the operating environment, installed in the operating environment under circumstances in which the operating environment may be degraded and possibly unreliable, or installed in an uncompromised environment, the battery service unit enables predictable and safe management and maintenance operations of the SOC.

Rechargeable battery packs require management and maintenance to set desired SOC levels. What the precise SOC level is depends upon the construction and nature of the energy storage elements making up the battery pack (e.g., type(s) of cell chemistry used in battery cells) and what operation the battery pack is expected to perform. For high-voltage battery packs that are assembled from tens, hundreds, and sometimes thousands of Lithium-ion energy storage elements arranged in parallel/series combinations, there are SOC levels and ranges that are optimum for various operations. In some cases, optimum SOC levels are set to minimally impact battery pack life expectancy. In some cases, an optimum SOC level is set to minimize risk of injury to persons and property in the vicinity of a battery pack and persons servicing the battery pack.

Embodiments of the present invention provide a single battery service unit applicable to this wide range of possible scenarios. Other embodiments could be specialized for a limited set of scenarios, and sometimes a single scenario. These scenarios include discharging/charging the battery pack in anticipation of: 1) storage; 2) transportation; 3) recycling; and 4) service. Storage ideally sets the SOC appropriate for maximizing life expectancy. During storage, a battery pack will lose charge and periodically the battery pack will need to be charged to maintain the SOC at the desired level. There are safety guidelines and legal requirements for transportation of a battery pack and the battery service unit is used to set the SOC appropriate for transport. Prior to recycling, it is desirable to remove as much energy as possible from the battery pack. The service scenario includes many different situations, including: a) servicing of the battery pack outside of its operating environment, b) servicing of the battery pack when installed in an operating environment that may be compromised due to an event that has or had the potential to induce damage to the battery pack where the battery pack or the supporting operating environment may be partially or wholly inoperative, and c) servicing of the battery pack in an intact and functioning operating environment.

When the operating environment includes an intact and functional EV, the battery service unit is able to leverage existing hardware/software infrastructure, such as a battery management system, to safely diagnose the state of a vehicle and then proceed to charge or discharge the battery pack as deemed appropriate under the circumstances. In the event the electric vehicle has been in a collision or subjected to other potentially damaging event (e.g., flooding), the battery service unit is used by a responder or other service professional to safely discharge the battery pack. Use of the battery service unit places the battery pack in a safer state allowing the vehicle to be moved or repaired with decreased risk.

Additionally, some embodiments of the battery service unit may also be used by service professionals to provide routine services related to maintenance and management of the EV. The battery service unit may include programmatic steps that guide the service professional through various functions for ensuring the battery pack is charged to proper levels and the battery management system is working correctly.

In the discussion herein, embodiments of the present invention are described as determining a desired SOC level and automatically setting an SOC level of an energy storage system to the desired SOC level. In some scenarios, the embodiments rely on an operating environment of the energy storage system to provide the current SOC information, and in other instances an external service unit determines (through measurement, calculation, or estimation) the current SOC level. Some embodiments transfer energy with respect to the ESS to automatically set the actual SOC level to the desired SOC level within a predetermined threshold.

The following discussion also includes reference to high voltage and high energy. In the context of the present invention, high voltage is a voltage exceeding 40 V. High energy in this context includes battery packs storing 10 kWh or more, though other embodiments may define high energy with a different energy capacity or capacity threshold.

It is known that energy storage elements have a certain amount of inherent self-discharge that slowly decreases the energy stored in the elements at a constant rate that is desirably pushed toward zero. In contrast and in the context of the present invention, intentional self-discharge is controllable (e.g., switchable and/or variable rate such that the intentional self-discharge component may be stopped. The inherent self-discharge is not switchable or associated with a variable discharge rate. The discussion below addresses structures and features associated with intentional self-discharge. As further discussed below, a preferred discharge rate for intentional self-discharge of a functional energy storage assembly is ~10 W selected from a range of discharge rates ~5-50 W FIG. 1 illustrates schematically an operating environment 100 including an electric vehicle (EV) 102 having a high-voltage battery pack 104 coupled to a battery service unit 106. Operating environment 100 is relevant to scenarios including fully intact EV 102 as well as situations in which EV 102 may be partially or wholly compromised. EV 102 includes a primary high-voltage (HV) port 108 for energy transfer and an associated digital control interface 110 as well-known. Primary HV port 108 provides a standard electromechanical interface for safely transferring charging energy from a charging station to battery pack 104. Associated with primary HV port 108 is digital control interface 110 for use by the charging station to monitor and control charging. Battery service unit 106 includes a complementary electromechanical interface to access battery pack 104 through primary HV port 108 and digital control interface when they are available and operational.

Figure 7:
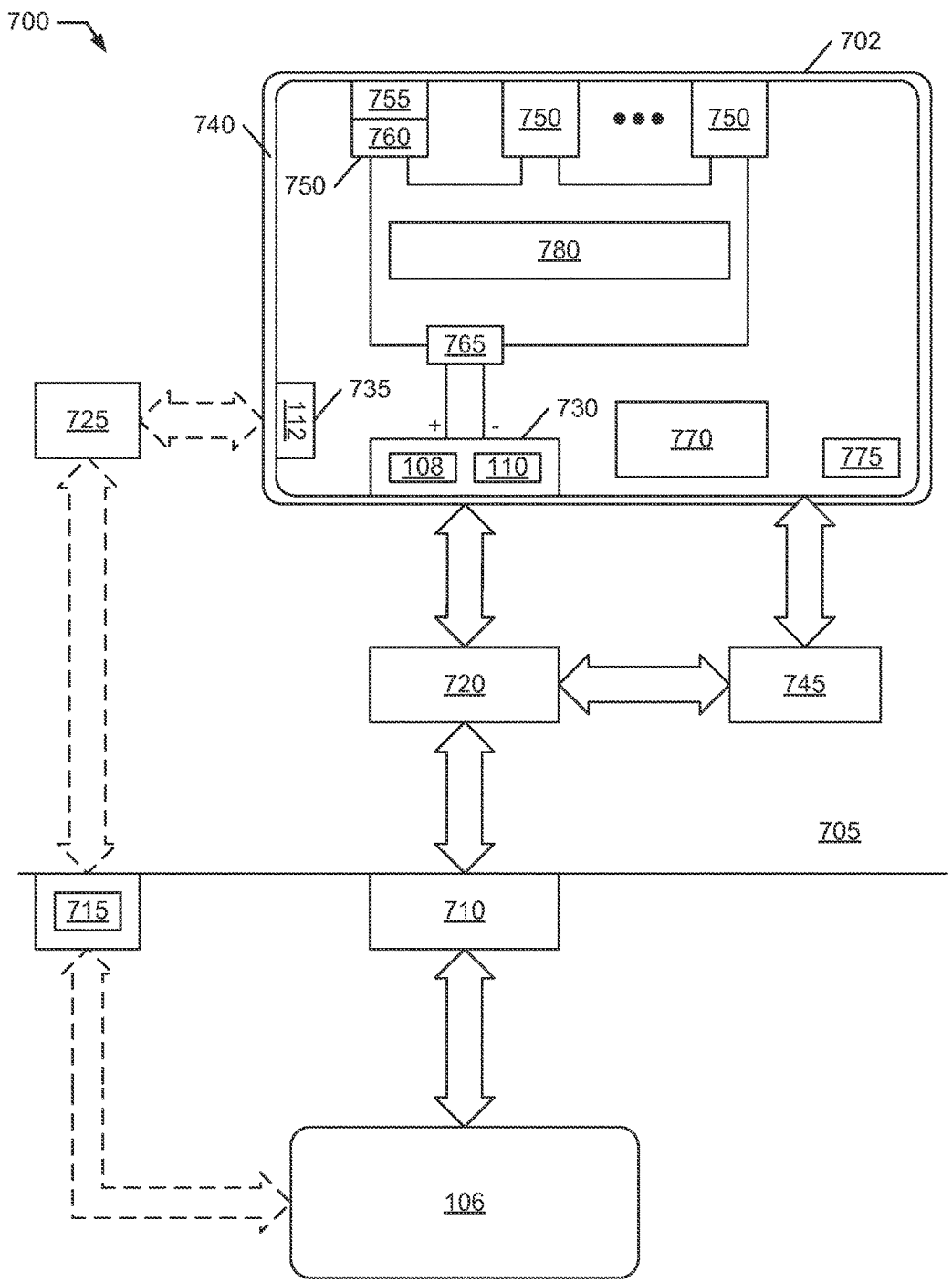
FIG. 7 illustrates an energy management scenario for a self-discharging high-voltage battery pack installed into an operating environment.

EV 102 further includes a secondary HV port 112 for direct management and maintenance access to battery pack 104. There are many possible implementations for the electromechanical interface of secondary HV port 112 and its interaction with battery pack 104. Some of the interface components and interactions are described herein. The discussion herein including the description of FIG. 7 provides further details of a representative secondary HV port 112.

Battery service unit 106 includes a high-voltage battery service interface 114 coupled to a high-voltage charger unit 116 through a high-voltage connection (HV) and control line (CTL) such as RS-232 communication protocol. In addition, battery service unit 106 further is coupled to a high-voltage discharger unit 118 also through a high-voltage (HV) connection and another control line (CTL) such as a digital communication interface like CAN-IO (Controller Area Network Input/Output), widely used in the automotive industry. An optional controller 120 (e.g., a computer or the like) interacts with battery service interface 114 using a digital control interface adapter 122 that also may produce signals compatible with CAN-IO. Instructions executing on controller 120 oversee operation of high-voltage battery pack 104 as well as charger unit 116 and discharger unit 118, as appropriate. Controller 120 may be integrated into battery service unit 106 in addition to implementations including an external element. Battery service unit 106 may include interface elements providing some control capability of battery service interface 114, charger unit 116, and discharger unit 118 independent of controller 120.

Charger unit 116 operates as a conventional charger appropriate for battery pack 104. Embodiments of the present invention provide a maximum charging rate of 1 kW, though other implementations may provide other charging rates. Discharger unit 118 includes energy dissipative and/or transformative elements (e.g., resistors) that absorb energy discharging from battery pack 104 using battery service unit 106 without damage or risk of injury. Embodiments of the present invention provide a maximum discharging rate of 10 kW, though other implementations may provide other discharging rates.

In the embodiment of FIG. 1, battery service unit 106 receives operational power from a power source 124. Power source 124 includes AC line power (e.g., grid or generator power) and DC battery power to power and control battery service unit 106. Battery service unit 106 is designed to support the wide range of scenarios and situations described herein and as such, some of those situations do not include predictable and easy access to stored energy of battery pack 104 (assuming that there is sufficient energy stored in the battery pack). To ensure that battery service unit 106 is useable in any context, it includes its own power source. In some implementations, battery service unit 106 may be powered, or charged, in whole or part by energy from battery pack 104.

An embodiment of battery service unit 106 includes: 1) a discharger (a fixed resistive load bank or an electronic load); 2) a variable voltage constant current or constant voltage power supply; 3) a controller; 4) a drive Inverter Simulator (e.g., capacitor); 5) an active discharge circuit for onboard capacitors—a. has redundant circuits for safety and reliability and b. automatically triggered via E-Stop, or when any HV cable is disconnected; 6) a passive discharge circuit for onboard capacitors; 7) a current sensor; 8) a method to protect contactors from opening under load; 9) a user configurable SOC (state-of-charge); 10) a method to conduct a Capacity Test; 11) a method to charge or discharge a battery to an appropriate level per regulatory shipping requirements; 12) an over voltage protection; 13) an under voltage (over discharge) protection; 14) an over temperature protection; 15) a voltage measurement display; and 16) status LED indicators.

Other features of selected embodiments of the present invention include: 1) a configurable HV bus capacitance (allows the battery service unit to work with batteries from a variety of powertrains); 2) a configurable low-voltage input board—a. low voltage signals vary from product to product: different connectors, different voltages, different expected resistances, by having a configurable and expandable low voltage input to the battery service unit it is capable of handling multiple products with only a different cable attachment; 3) all relays, sensors, and internal devices controlled over CAN (allows easy communication from one device to the next as the CAN messages are changed as necessary); 4) may be implemented as a mobile product, to allow deployment at vehicle service centers or roadside assistance (post vehicle crash event for example) or throughout a storage facility and the like; 5) a configurable voltage range to work across battery product lines; and 6) implemented as a module discharge system to work across battery product lines.

A general description of operation includes battery service unit 106 coupling to battery pack 104 (whether installed or non-installed in an operating environment) and auto-charging/discharging battery pack 104 to a predefined user determined SOC level.

In FIG. 1, the embodiment is illustrated as having direct functional connections between HV battery pack 104 and battery service unit 106. In various implementations, there may be one or more wiring harnesses and connectors (for example, at the signal/mechanical interfaces of EV 102).

Figure 2:
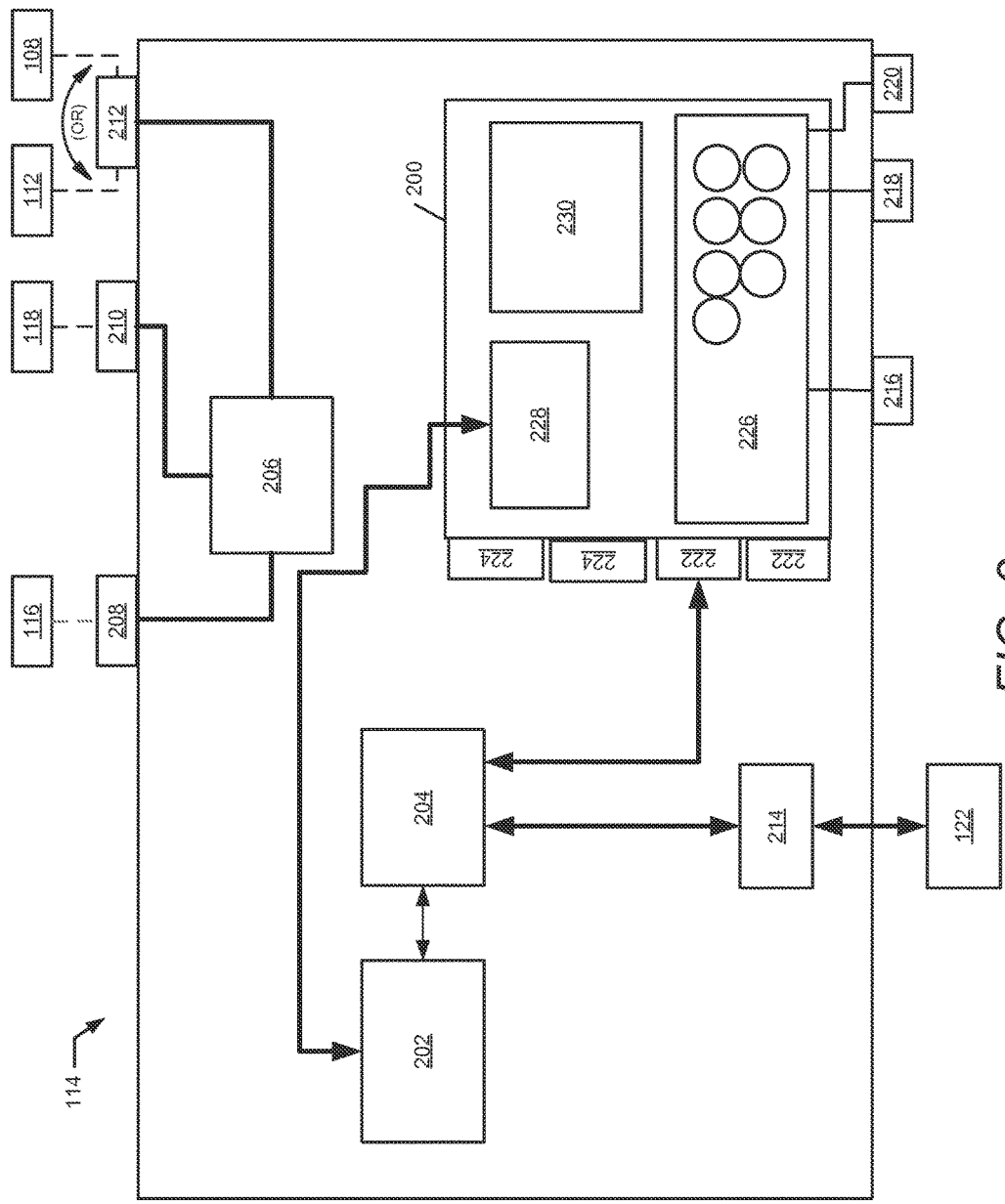
FIG. 2 is another block diagram illustrating schematically selected subcomponents in a high-voltage battery service interface used in the battery service unit in accordance with some embodiments of the present invention.

FIG. 2 illustrates schematically selected subcomponents of high-voltage battery service interface 114 illustrated in FIG. 1. High-voltage battery service interface 114 includes a high-voltage battery service communications interface 200, a digital control signaling module 202, a digital control interface switch 204, a set of high-voltage terminals 206, and various interconnects to other systems including a high-voltage power supply connector 208, a high-voltage load bank connector 210, a high-voltage primary/secondary HV port connector 212 for connection to high-voltage battery pack 104, a digital I/O module 214 for connection to adapter 122 (e.g., a dongle), and a digital control interface port 216. The connection to the personal computer uses digital I/O module 214 having a USB (universal serial bus) connection to controller 120 and a digital I/O connection to high-voltage battery service communications interface 200 compatible with the CAN-IO standard or similar protocol. High-voltage battery service interface 114 includes a digital control interface port 216, an emergency shut-off switch 218, and an on-off switch 220, as well as one or more internal digital I/O connectors 222 and one or more external digital I/O connectors 224.

Interface 200 further includes an operating environment simulator 226, a set of charge/discharge relays 228, and a high-voltage discharge logic and load 230. Simulator 226 is implementation specific and includes a combination of components that create an electrical characteristic composite or "signature" matching the intended operating environment of battery pack 104, such as an EV. Simulator 226 mimics the operating environment and provides battery pack 104 with the necessary interface elements (e.g., electrical signals and loads) to enable battery pack 104 to transition into an operational mode. For example, battery pack 104 commonly includes internal contactors that must be powered and set into a particular configuration before battery pack 104 may transfer energy. Simulator 226 enables battery service unit 106 to operate such high-voltage contactors so charging or discharging may be possible. In some embodiments, simulator 226 includes various capacitors and/or inductors matching the impedance of the operating environment and, when combined with predetermined resistors within battery pack 104, producing time constants that may be identified with a particular vehicle. Battery pack 104 is receptive to receiving various commands once it is in the operational mode. In the implementation illustrated in FIG. 2, simulator 226 is capable of being reconfigured to simulate different operating environments.

In operation, high-voltage battery service communications interface 200 receives low-voltage inputs from battery pack 104 over digital control interface port 216 once communication is established. In some embodiments, controller 120 may send digital commands over digital control interface switch 204 and to digital control signaling module 202 to toggle status in the battery pack indicating the car is in a specific state (e.g., a "DRIVE" state), without regard to whether the operating environment is currently able to support the specific state. Charging battery pack 104 may be achieved by enabling connectors to high-voltage power supply connector 208 while discharging may occur through enabling connectors to high-voltage load bank connector 210, typically one or several banks of resistors maintained in a separate enclosure along with fans or other heat dissipation subcomponents.

Figure 3:
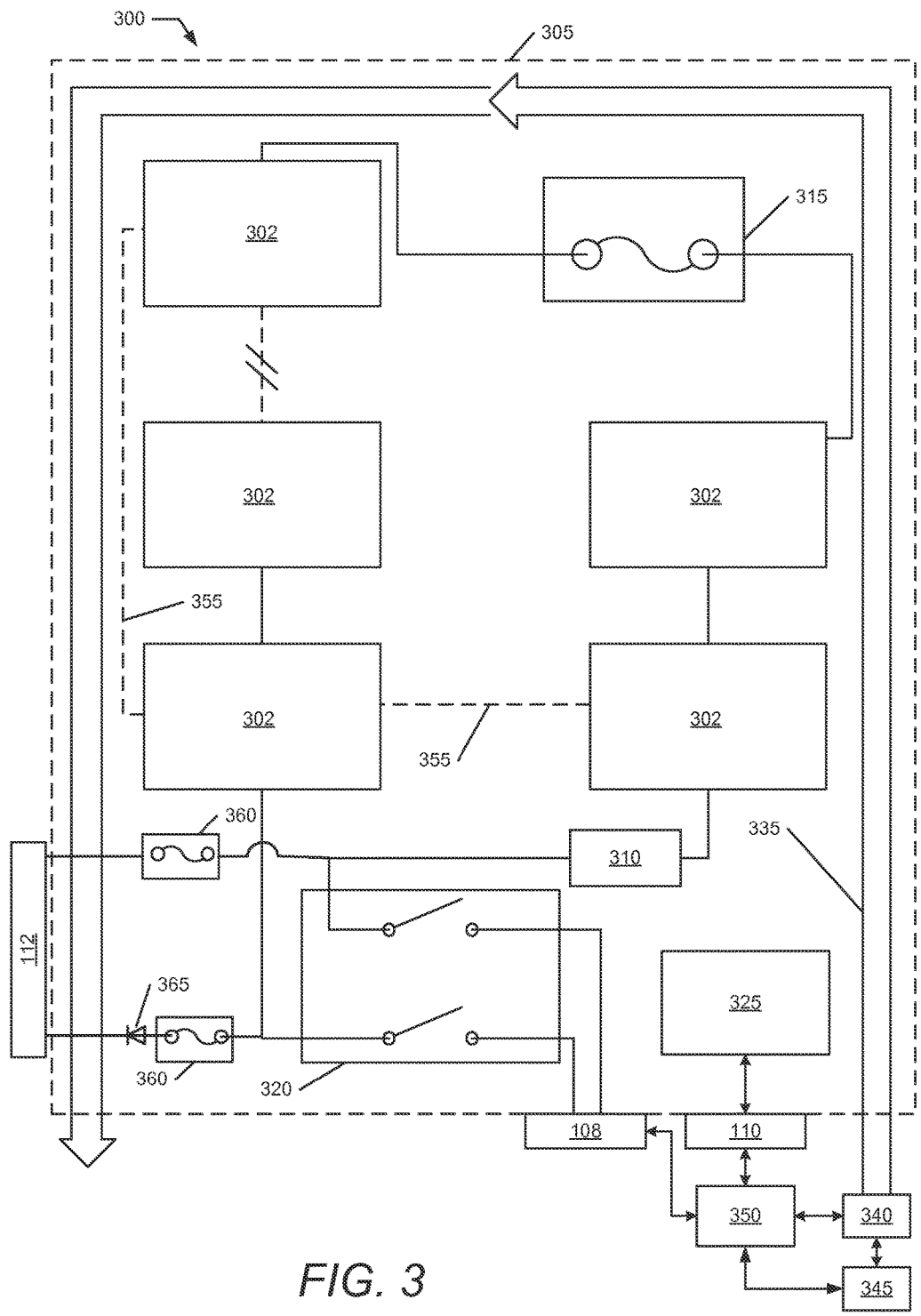
FIG. 3 is a schematic design of a battery pack including a primary charge port and a secondary charge port used by the battery service unit in accordance with some embodiments of the present invention.

FIG. 3 illustrates a schematic design for a battery pack including a primary HV port and a secondary HV port used by the battery service unit in accordance with some embodiments of the present invention. FIG. 3 illustrates a battery pack 300 including a plurality of electrically-serially-coupled battery modules 302 contained within a high-voltage battery enclosure 305. Battery pack 300 further includes a current sensor 310, a fuse 315, a set of contactors 320, a battery management system (BMS) 325, a primary power connector (e.g., primary HV port 108), a control interface (e.g., digital control interface 110) and secondary power connector (e.g., secondary HV port 112). Enclosure 305 typically provides a structural\environmental container (sometimes hermetically closed or semi-sealed) for battery pack 300 components. Battery pack 300 often includes a coolant distribution system (generically represented by coolant loop 335 and pump 340) isolated and insulated from the battery pack 300 components and configured to control their temperature. As will be further described herein, pump 340 (or other coolant controller) is preferably powered by energy from an auxiliary energy storage system 345 (typically a 12V battery) different from battery pack 300. Interrupting available energy from battery pack 300 would interrupt coolant flowing in coolant loop 335 without use of auxiliary energy storage system 345. For ease in explanation, a discrete controller 350 is also shown for interfacing with BMS 325, pump 340, and auxiliary energy storage system 345 to control the detection and response modalities of the preferred embodiments. Controller 350 may be integrated into other control functions in some embodiments.

Battery pack 300 may include any number of modules 302 different from the five shown in FIG. 3. Modules 302 are serially-coupled inside enclosure 305 with a series path shown in solid lines. In series with serially-coupled modules 302 is current sensor 310, fuse 315, and contactors 320. Current sensor 310 measures series current in battery pack 300. When battery pack 300 is working properly, all modules 302 exhibit the same current and current sensor 310 indicates this value. Fuse 315 is disposed in this series path and is designed to protect against over current conditions.

Contactors 320 are switching systems for selectively communicating modules 302 to an external load through the primary power connector. Battery management system (BMS) 325 controls contactors 320 and includes controllers and sensors for measuring and determining desired parameters (e.g., operating and SOC characteristics and the like) of battery pack 300. As previously mentioned, BMS 325 will generally close contactors 320 when battery service unit 106 provides a proper electrical signature of an appropriate operating environment. The provision of the signature causes the BMS 325 to operate as if battery pack 300 is actually installed in a valid and intact operating environment. The secondary power connector, optionally also coupled to the "cell side" of contactors 320, are used as an alternative energy access port (e.g., the secondary HV port/service port described herein). In some embodiments, the secondary power connector is used to provide a service access port for direct charging and/or discharging operations of battery pack 300 such as when some or all portions of the battery pack 300 are compromised and/or when BMS 325 also is not operable and cannot close contactors 320.

Battery pack 300 further includes current protection devices 360 (e.g., fuses) limiting energy flow relative to the secondary power connector 332. Some embodiments further include a diode 365 or the like to limit energy flow in one direction, such as ensuring that the alternative energy access port may be used for one of charging or discharging only.

While great care is used in designing, manufacturing, and testing battery pack 300, sometimes it is the case that an internal short 355 may develop among one or more of the series elements. In some cases, these shorts may be the result of a vehicle being in a collision, a catastrophic event (natural or man-made), or general wear or failure. Representative internal shorts 355 are shown in dashed lines in FIG. 3, but it is understood that internal shorts may develop elsewhere, including internal shorts contained within a series stackup of module 302. One or more of the implicated series elements sourcing current through internal short 355 contribute current through the intended series path as well as through internal short 355. These series elements can thus begin to exhibit sustained high levels of current that may lead to component over-temperature, failure, and sometimes a hazard. This is sometimes further complicated as the object(s) which formed all or part of the short circuit may also create dangerous heat/temperatures.

Internal short 355 may occur between adjacent high voltage (HV) chain components at different potentials or through the conductive, isolated enclosure in the case that isolation is lost at two or more points, or through another medium, such as a conductive fluid such as salt water, water, water/glycol mixtures, and the like. An impedance of internal short 355 and a number of series elements affected by internal short 355 determines the short current. In some cases internal short 355 may be intermittent. Internal short 355 will have a heat capacity that also helps determine whether internal short 355 will change its impedance (for example, become open circuit) as internal short 355 dissipates power. In some embodiments, BMS 325 reports these conditions to battery service unit 106 allowing it to determine how to charge or discharge the battery pack 300.

When BMS 325 and battery pack 300 are intact and operating properly, battery service unit 106 connects through the primary power connector. This is advantageous as battery service unit 106 is able to mimic the vehicle's operation in the specific state and utilize BMS 325 to open and close contactors 320 in a safe manner minimizing wear and tear on the battery pack and its components. Other control and safety measures available to the vehicle remain available in this mode of operation.

When BMS 325 and/or battery pack 300 exhibit one or several faults or failures, battery service unit 106 may instead engage connections through the secondary power connector thereby bypassing the controls of BMS 325. While this alternate approach may be necessary in an emergency situation such as a collision or other event, such discharging of the battery pack 300 through the secondary power connector may result in partial or severe damage to the underlying battery cells and interconnections.

Figure 4:
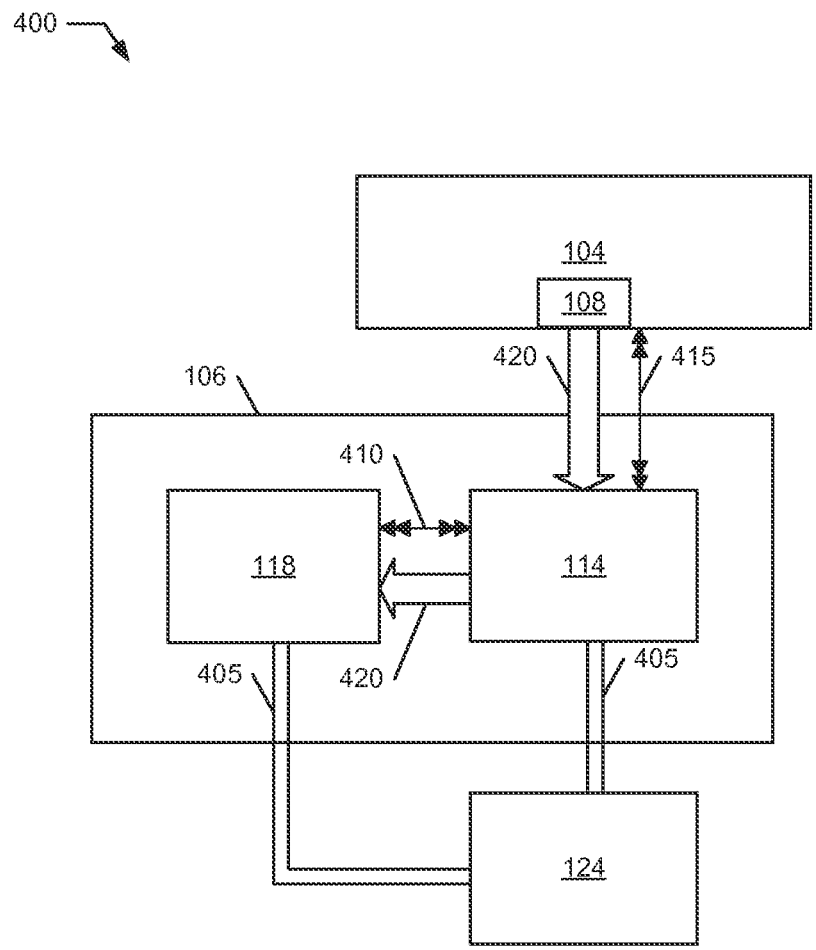
FIG. 4 illustrates an energy transfer for a high-voltage energy pack 104 in an extra-operational environment 400 using the primary charging connector.

FIG. 4 illustrates an energy transfer for a high-voltage battery pack 104 in an extra-operational environment 400 using the primary charging connector. In extra-operational environment 400, battery pack 104 is not installed in its operating environment. Battery service unit 106 is used to automatically set a desired SOC level for battery pack 104. In some embodiments, battery service unit 106 includes preselected scenarios (e.g., storage, ground transportation, air transportation, recycling, emergency discharge, and the like), each having a predetermined associated SOC level. An operator choosing one of the preselected scenarios causes battery service unit 106 to automatically charge/discharge battery pack 104 to the predetermined SOC level associated with the selected scenario.

In FIG. 4, extra-operational environment 400 configures battery service unit 106 to discharge HV energy from battery pack 104. Battery service unit 106 provides operational power (e.g., 120-230 VAC) from power source 124 to battery service interface 114 and to discharger unit 118 using power lines 405. Battery service interface 114 issues a remote enable signal to discharger unit 118 using a remote enable signal line 410 and communicates with and controls battery pack 104 using a digital I/O line 415. Depending upon battery pack 104 and the interface method, it may be further necessary for battery service unit 106 to provide simulation information to simulate an operating environment for battery pack 104 before it may be commanded and/or before an initiation of an energy transfer event. High-voltage lines 420 couple battery pack 104 to battery service unit 106 and internally couple battery service interface 114 to discharger unit 118. Battery service unit 106 may charge HV energy into battery pack 104 by coupling charger unit 116 to battery service interface 114 and appropriately setting the control signals. In some cases a different mechanical interface (e.g., wiring harness) may be necessary to couple battery service unit 106 to battery pack 104 for charging.

Figure 5:
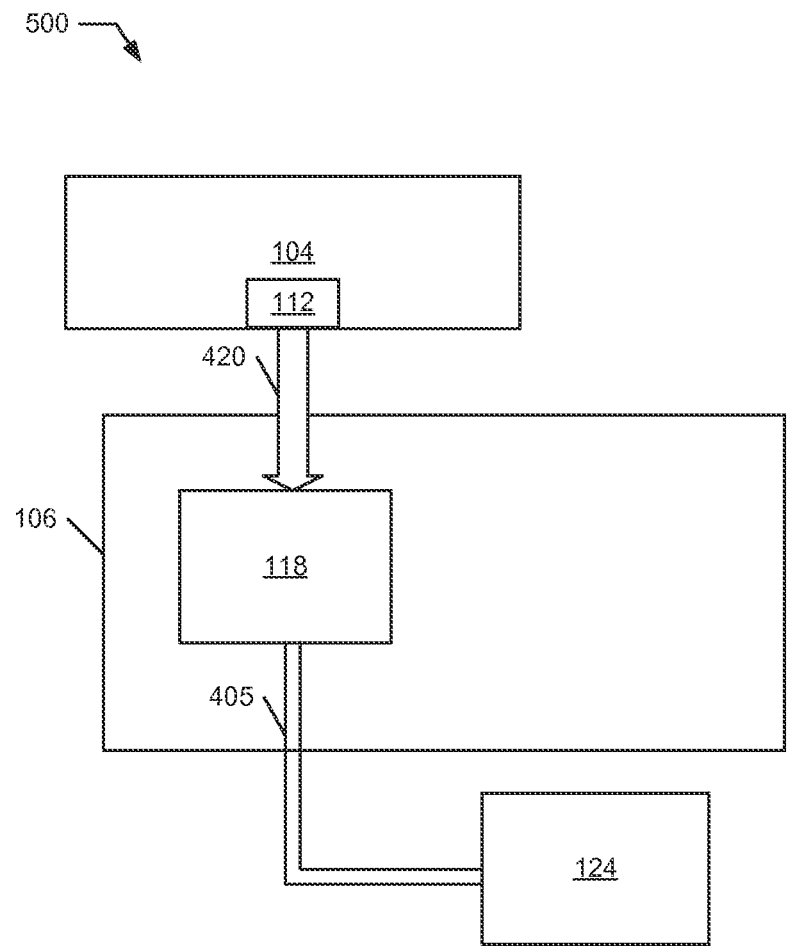
FIG. 5 illustrates an energy transfer for a high-voltage energy pack 104 in an extra-operational environment 500 using the secondary charging connector.

FIG. 5 illustrates an energy transfer for a high-voltage battery pack 104 in an extra-operational environment 500 using the secondary charging connector. In extra-operational environment 500, battery pack 104 is not installed in its operating environment. However the embodiment of FIG. 5 is also applicable to uses in which battery pack 104 is installed into its operating environment but for one reason or another (such as those described herein) the primary charging connector is not used. Battery service unit 106 is used to automatically set a desired SOC level for battery pack 104. In some embodiments, battery service unit 106 includes preselected scenarios (e.g., storage, ground transportation, air transportation, recycling, emergency discharge, and the like), each having a predetermined associated SOC level. These SOC levels are set for controlled SOC charging/discharging with an expectation that battery pack 104 may be operational at conclusion of the charging/discharging event. An operator choosing one of the preselected scenarios causes battery service unit 106 to automatically charge/discharge battery pack 104 to the predetermined SOC level associated with the selected scenario, and when possible, doing so in a way that does not negatively affect future performance (e.g., lifetime). Operational environment 500 further supports an emergency discharge mode in which a primary goal is removal of stranded energy of battery pack 104, sometimes as quickly as possible. Under this mode, risks of damage to battery pack 104 are increased. Some embodiments of the present invention provide more safety features for energy transfer using the primary port and more robust options for energy transfer using the secondary port.

In FIG. 5, extra-operational environment 500 configures battery service unit 106 to discharge HV energy from battery pack 104 directly through discharger unit 118 without simulation or communication with respect to the battery pack. Battery service unit 106 provides operational power (e.g., 120-230 VAC) from power source 124 to discharger unit 118 using power line 405. High-voltage lines 420 couple battery pack 104 to battery service unit 106 and internally couple battery service interface 114 to discharger unit 118. Battery service unit 106 may charge HV energy into battery pack 104 by coupling charger unit 116 to battery pack 104 using the secondary HV connector. In some cases a different mechanical interface (e.g., wiring harness) may be necessary to couple battery service unit 106 to battery pack 104 for charging.

The disclosed embodiments of battery service unit 106 anticipate a wider range of uses for discharging a battery pack 104. These uses depend upon whether battery pack 104 and/or its operating environment is intact and operational. For a functional battery pack 104, there are three discharge options: 1) use processes and devices of the operating environment to natively discharge energy which may be automatically commanded by battery service unit 106; 2) battery service unit 106 discharges battery pack 104 as described in FIG. 4; and 3) battery service unit 106 commands battery pack 104 to self-discharge as described in the incorporated patent application. Options 1 and 2 are configured to have a preferred discharge rate of ~10 kW and a range of discharge rates 1-20 kW (vehicle or load bank) and option 3 has a preferred discharge rate of ~10 W and a range of discharge rates 5-50 W. In option 1, the operating environment of an EV includes cabin temperature controls (e.g., heater, air conditioner with HVAC compressor), powertrain coolant system, and low voltage loads (e.g., headlights). One or more of these systems may be enabled and actuated by battery service unit 106 to have the operating environment discharge battery pack 104. This is distinguished from option 3. In option 3 the discharging elements are contained within battery pack 104 while in option 1, the discharging elements are outside of battery pack 104 but within its operating environment. Option 2 provides the discharging elements outside of the operating environment. Some implementations may include a combination of options.

Specific details of preferred structures and methods for self-discharge are described herein with respect to FIG. 7, in general self-discharge refers to use of power dissipative elements of battery pack 104 to intentionally discharge energy and decrease availability for standard EV operation which is contrary to the typical systems which try to conserve/preserve energy for operational power uses. Battery pack 104 typically includes power conserving features and some embodiments of the present invention include an ability to override or limit the power-conserving features to dissipate power. In some cases the power dissipation is maximized and may compromise or damage battery pack 104 and in other cases the self-discharging power dissipation is maximized while also preserving future operation of battery pack 104. The internal power dissipative elements include processors, transmitters, and other elements that can collectively dissipate significant power when operated in the non-power conserving modes. In some embodiments, for self-discharge of battery pack 104 or when the operating environment uses dissipative elements outside of battery pack 104, the coolant system is enabled as heat is rejected into the circulating coolant to reduce risk of discharging events. In some situations, intentional shorts are created into the coolant in order to induce energy-consuming processes (e.g., hydrolysis).

For a non-functional battery pack 104, there are also three discharge options: 1) battery service unit 106 discharges battery pack 104 as described in FIG. 5 with a preferred discharge rate of ~6 kW and a range of discharge rates 1-6 kW; 2) battery service unit 106 commands operational components of battery pack 104 to self-discharge as described herein; and 3) service personnel travel to onsite of battery pack 104 to safely discharge it manually.

Figure 6:
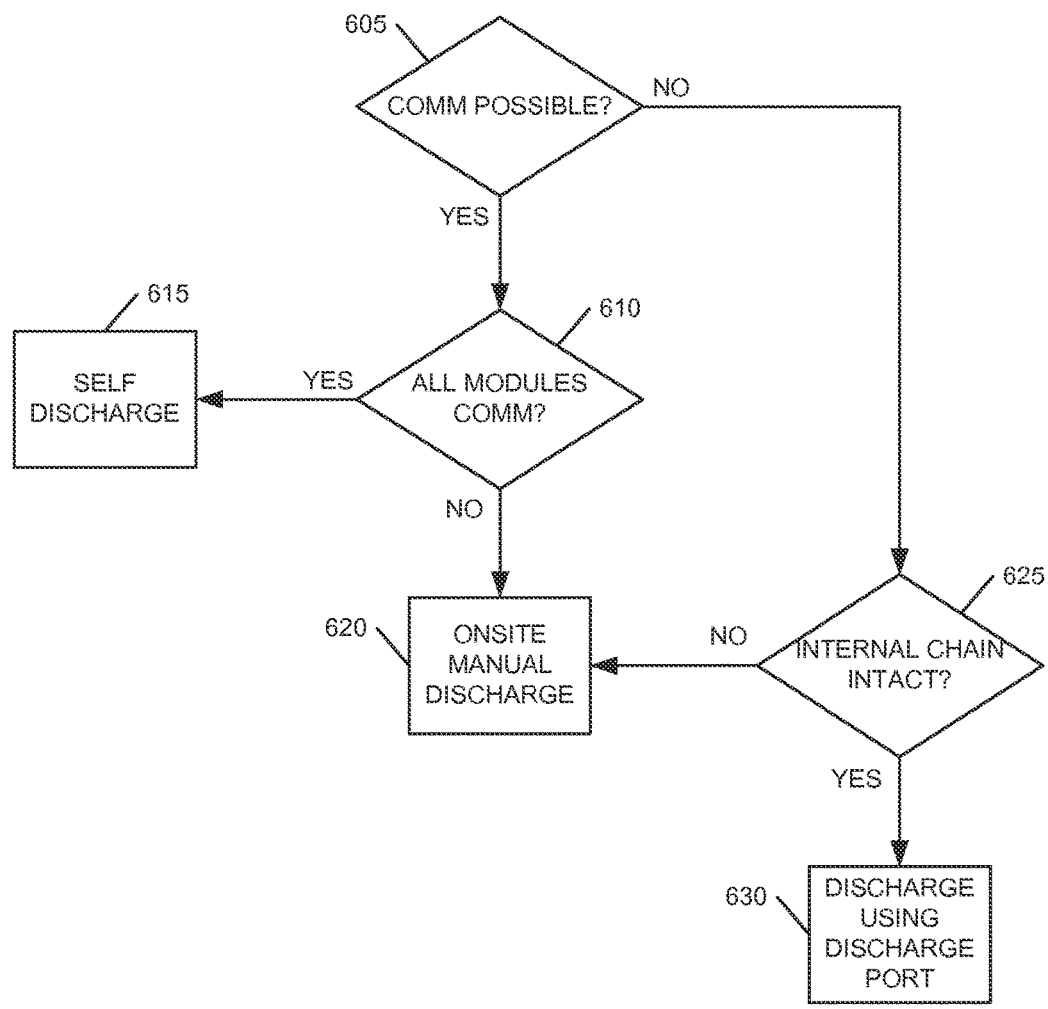
FIG. 6 illustrates a flowchart of a discharge process 600 for a non-functional battery pack 104.

FIG. 6 illustrates a flowchart of a discharge process 600 for a non-functional battery pack 104. Process 600 includes step 605-step 630. Process 600 begins at step 605 to test whether communication with BMS 325 is possible. When communication with BMS 325 is possible, process 600 next performs a test at step 610 to determine whether it is possible to communicate with all modules 302. When communication with all modules 302 is possible, process 600 commands battery pack 104 to perform a self-discharge option as described in option 2 above. When the test at step 610 determines it is not possible to communicate with all modules 302 (e.g., a module failure, wire damage, or the like), process 600 performs step 620 for an onsite manual discharge as described above in option 3. When the test at step 605 determines that it is not possible to communicate with BMS 325 (e.g., a failure of BMS 325 or a wire failure or the like), process 600 performs a test at step 625. The test at step 625 determines whether an internal high-voltage series module chain of modules 302 is intact. When the test at step 625 determines that the HV chain is intact, process 600 performs step 630 which uses battery service unit 106 to discharge battery pack 104 using the discharge port (e.g., the secondary port) as described above in option 1. When the test at step 625 determines that the HV chain is not intact (e.g., a fuse is blown or a cable is damaged, or the like), process 600 performs step 620 for an onsite manual discharge.

FIG. 7 illustrates an energy management scenario 700 for a self-discharging high-voltage battery pack 702 installed into an operating environment 705. Battery pack 702 includes the structures, features, and arrangements associated with battery pack 104 and battery pack 300 described herein with the addition of self-discharge structures, except where context suggests otherwise.

Operating environment 705 includes a vehicle, load bank, or other implementation using a rechargeable high energy storage system. An exterior interface to operating environment 705 includes a primary access 710 and a secondary access 715.

An operator of battery service unit 106 has an option to interact with battery pack 702 installed in operating environment 705 using either primary access 710 or secondary access 715. Operating environment 705 includes a first processing system 720 that is a collection of processing, management, and safety systems. First processing system 720 may include contactors, fuses, filters, processors/controllers, and the like interposed between primary access 710 and battery pack 702. Some embodiments of operating environment 705 also optionally include a secondary processing system 725 associated with a collection of processing, management, and safety systems. Secondary processing system 725 may include contactors, fuses, filters, processors/controllers (e.g., battery management system), and the like interposed between secondary access 715 and battery pack 702. Some elements may be shared between first processing system 720 and secondary processing system 725.

For some energy management scenarios, battery pack 702 is physically secured and sealed within an enclosure. For performance and safety reasons, there are limited points of ingress and egress. A primary point of ingress and egress is an operational port 730. Operational port 730 provides controlled access to the energy storage components of battery pack 702 and includes primary HV port 108 and digital control interface 110. There may be contactors, fuses, filters, processors/controllers (e.g., battery management system), and the like controlling energy transfer through operational port 730, with those elements also represented by operational port 730. Some components may be provided in first processing system 720, operational port 730, or both.

It is through operational port 730 that standard charging and discharging events occur. The charging and discharging events are strictly controlled for enhanced safety and maximizing life expectancy for battery pack 702 without unduly limiting performance. In the context of an EV for the operating environment, some implementations of operational port 730 must receive a proper signature from operating environment 705 that represents that battery pack 702 is properly installed in the operating environment and functioning correctly. Battery service unit 106 has the ability to simulate or induce generation of this proper signature to enable energy transfers with respect to operational port 730. And in typical operation, rates of energy transfers using operational port 730 are sharply constrained within predetermined design limits to balance some of the competing interests.

These are some of the reasons that accessing stranded energy from battery pack 702 using operational port 730 is sometimes slower and more complex. Further, operating environment 705 sometimes experiences certain types of events that compromise access and use of primary access 710 and/or damages first processing system 720 and/or damages operational port 730.

To address any drawbacks with such scenarios, energy management scenario 700 includes a service port 735 (that includes secondary HV port 112) installed at a strategic location of the enclosure for battery pack 104. Failure analyses of operating environment 705 and construction, layout, and reinforcement of the enclosure identify failure modes and associate service port 735 at locations that are least likely to be compromised whenever operating environment 705 experiences an event sufficient to make operational port 730 unavailable. Unavailability includes complete or partial damage that either makes battery pack 702 inaccessible or increases risks of accessing battery pack 702 through primary access 710 such that the risks exceed a predetermined threshold.

When using secondary access 715 for externally extracting energy, service port 735 may be configured in a discharge-only mode to remove or sufficiently reduce any stranded energy within battery pack 702. One way, among others, that this may be done is to include a discharge diode in secondary processing system 725 or service port 735 that limits energy transfers through secondary access 715 as discharge-only. This is different from operational port 730 which is illustrated as supporting bi-directional energy transfers (e.g., charging and discharging). In other implementations, service port 735 is configured as charge only.

In some embodiments service port 735 differs from operational port 730 in another respect. Service port 735 is intended for uses in which operational port 730 is not available and as such represents a contingent port. As a contingent port, supporting discharge events in potentially extreme situations, complexity is reduced and ease-of-use is increased, all the while preserving safety. One consequence of this reduced complexity is that some of the safeguards regarding constraints on discharging energy transfers (e.g., maximum energy transfer rate, SOC low energy targets and thresholds, and the like) are not present or disabled. These considerations are secondary at best to the goal of removing stranded energy from battery pack 702.

The reduced complexity enables simpler operation and simpler requirements for battery service unit 106, increasing the accessibility and use in this configuration. In certain cases, such as collision, or emergency/urgent event, then first responders may respond more quickly and second responders may remove stranded energy more simply and a version of battery service unit 106 capable of maintaining a desired energy level (including removing stranded energy) for battery pack 702 is simpler to operate and could be made less costly.

Some details of the internal layout of battery pack 702 are illustrated in FIG. 3, with operational port 730 associated with primary HV port 108 and service port 735 associated with secondary HV port 112. Service port 735 is coupled to a "cell" side of contactors 320 while operational port 730 is coupled to contactors 320 away from modules 302.

When installed, battery pack 702 is typically mechanically and electrically secured in operating environment 705, such as contained within a rigid enclosure mounted to a portion of a chassis inside an EV. Operating environment 705 thus limits easy access to operational port 730 and to service port 735. Operating environment 705 may therefore provide electro-mechanical interfaces between primary access 710/secondary access 715 and battery pack 702. These electro-mechanical interfaces include conductors (e.g., a plus voltage conductor and a negative voltage conductor) and a common implementation for couplers to such electro-mechanical interfaces is use of plugs having pins that mate to complementary receptacles to provide electrical communication.

Operational port 730 provides the principle access and its electro-mechanical interface is defined and implemented for frequent use. Primary access 710 is configured for easy and simple access by the user, such as when charging at a charging station.

Service port 735 in contrast is intended for specialized limited access. Service port 735 is coupled into battery pack 702 differently than operational port 730 as noted herein, and those differences increase risks to battery pack 702 whenever service port 735 is used. For example, it is possible that discharging energy from battery pack 702 using service port 735 could disable or severely limit future operation of battery pack 702, especially when the discharging event is aggressive (e.g., high energy transfer rate). Some implementations of the mechanical interface provide enhanced grounding when employing service port 735. For example, the mechanical features of secondary access 715 may first ground a battery chassis before making electrical contact with any power conductors.

Some embodiments include special interface requirements for service port 735 and/or secondary access 715. These requirements are intended to prevent or limit access to battery pack 702 using service port 735. Some of these requirements may include installation of secondary access 715 at a hidden location in the operating environment to thus secure access to secondary access 715 so that is may be accessed only by use of a special tool. Some embodiments include use of an electro-mechanical interface with different plug/receptacle form factors from those used with primary access 710.

When describing the self-discharge capabilities of battery pack 702 is considered functional at least with regard to key components that are intact and used for safe self-discharge. Self-discharge of battery pack 702 includes two broad classifications of self-discharge: 1) self-discharge when not installed in operating environment 705, and 2) self-discharge when installed in operating environment 705. One difference in these classifications addresses heat dissipation. Energy is dissipated internally and results in generation of heat. Faster self-discharge is associated with generation of more heat. To safely self-discharge battery pack 702 this generated heat must not cause the temperature of battery pack 702 to rise above safe operating limits. There are generally more options for maintaining the temperature within safe operating limits when battery pack 702 is installed in operating environment 705.

Battery pack 702 includes internal coolant systems including a coolant loop illustrated in FIG. 7 by a coolant channel 740. Coolant may be cooled and recirculated through coolant channel 740 by a coolant system 745 supported by operating environment 705. Coolant system 745 typically includes a pump, a coolant reservoir, and a heat exchanger.

During operation of battery pack 702, heat is predominately generated by a plurality of battery modules 750 serially coupled to each other. Each battery module includes an energy storage assembly 755 and a controller 760. Energy storage assembly 755 is typically a collection of parallel and series connected individual storage elements (e.g., battery cell, ultracapacitor, and the like). An interlock 765 (e.g., a contactor) selectively couples energy from modules 750 to operational port 730. A battery management system (BMS) 770 is coupled to the active devices within the enclosure to monitor and control the various components. Self-discharge components include a sensor 775 disposed within the enclosure and a self-discharger 780. Coolant channel 740 is thermally coupled to battery modules 750 which are packed into the enclosure. Coolant from coolant channel 740 may be made available to any component within the enclosure.

While self-discharger 780 is schematically illustrated in FIG. 7 as a stand-alone function, in practice some or all of the self-discharging operation may be integrated with one or more other components. For example, there is the possibility of implementing self-discharging at one or more of cell-level self-discharge, module-level self-discharge, and pack-level self-discharge. In cell-level self-discharge, each energy storage assembly 755 (or individual elements) includes, or is associated with, some type of switchable\actuable load (some of which are described herein) and that switchable load may be triggered by one or more of battery service unit 106, controller 760, and BMS 770. In module-level self-discharge, each module includes, or is associated with, some type of selectively switchable\actuable load (some of which are described herein) and that switchable load may be triggered by one or more of battery service unit 106, controller 760, and BMS 770. Similarly, in pack-level self-discharge, the pack includes, or is associated with, some type of switchable load (some of which are described herein) and that switchable load may be triggered by one or more of battery service unit 106 and BMS 770. With the disclosed implementation, some of the internal loads are dual-use loads that have one purpose during "normal" operation and the self-discharging function for self-discharging use. The normal use is typically limited or controlled to minimize energy dissipation while achieving the desired normal function. In the self-discharging function, those limits/controls are often overridden or limited in importance to increase energy dissipation. Some self-discharger loads are specifically designed for self-discharge, such the disclosed option of directing stored energy into the coolant to purposefully initiate energy-consuming hydrolysis.

There are many possible ways to implement self-discharge by self-discharger 780. For a functional battery pack 702 installed in operating environment 705, the following is a representative arrangement. In general, sensor 775 is configured to detect an impact that is potentially serious enough that battery pack 702 could pose a hazard to persons and/or property in the vicinity of operating environment 705. The detector could be a motion detector (e.g., acceleration) that asserts a signal to BMS 770 upon detecting a collision event. BMS 770 performs a quick system check to test for proper operation of systems supporting self-discharge when the collision event is of the type conforming to a predetermined profile.

BMS 770 then automatically signals self-discharger 780 to initiate self-discharge mode. BMS 770 actuates any intact and functional support systems (e.g., coolant flow) to support self-discharge. Depending upon a particular implementation, BMS 770 dynamically monitors self-discharge related parameters (e.g., discharge rate and temperature) so that self-discharge proceeds safely. As temperature rises, BMS 770 may slow self-discharge or increase cooling. The various modes of operation for self-discharger 780 sometimes include this ability to modulate energy self-discharge rate directly while in other cases modulation includes regulation of a duty cycle to limit how long self-discharger 780 is active.

In some cases, a responder arriving at the location of operating environment 705 may independently confirm that self-discharge of battery pack 702 is necessary or desirable as well as establishing which systems are intact and sufficiently functional to support a self-discharge mode. Battery service unit 106 may help with diagnostics in this regard. The responder uses battery service unit 106 to activate self-discharger 780 directly, or to cause BMS 770 or controller 760 to perform a self-discharge evaluation and thereafter begin self-discharge when it is safe to do so.

Some of the features and functions associated with BMS 770, sensor 775, and self-discharger 780 may be distributed among or integrated into other structures. Self-discharging may be initiated completely automatically in some modes, and in others it may be manually initiated by an operator of operating environment 705 or an operator of battery service unit 106.

For a functional battery pack 702 not installed in operating environment 705, the following is a representative arrangement. Battery service unit 106 is coupled directly to operational port 730 or service port 735 (some embodiments may include a communication protocol associated with the service port) to activate self-discharger 780. In these self-discharge modes, battery service unit 106 may be less complex, costly, and simpler to carry than a version that includes the charger and/or discharger units.

In these self-discharge modes, self-discharger 780 continues to operate until deactivated, the SOC reaches a target value, or as much energy as possible has been dissipated from battery pack 702 (a discharge endpoint). These different modes may be set or controlled by BMS 770, self-discharger 780, and/or battery service unit 106.

As suggested above, there are many different possible self-discharge implementations. Energy storage within battery pack 702 is inherently lossy and the configuration of battery pack 702 includes many energy conserving features and components. In some embodiments, self-discharger simply deactivates, defeats, or reduces an effectiveness of certain energy conserving measures and/or configures operation of battery pack 702 into a maximum safe energy consuming mode. In other embodiments, additional elements are added and configured to enable self-discharge. Some of these energy conserving features include selective sleep mode for transmitters of a pack-wide communications system, isolated communication channels, reduced power to on-board processors. Defeating these energy conserving features includes waking transmitter channels even when no transmissions are occurring or operating controllers and processors at full power when otherwise not required by their control/process requirements.

Battery Balancing

It is common to use a battery balancing mechanism with battery pack 702. In this context, the battery balancing mechanism is connected to all the energy storage elements and sets the voltages to the same nominal voltage. The battery balancing mechanism includes energy dissipative elements (e.g., resistors) that bleed off energy from those elements with too much energy. Self-discharger 780 includes a dual-use of the battery balancing mechanism configured to selectively dissipate all energy from all storage elements until the discharge endpoint is reached.

Battery Precharge

It is common in high voltage battery packs, such as battery pack 702, to use a battery precharger. The battery precharger protects against an inrush of current by limiting the operating current until a load capacitance is charged. The battery precharger includes relays and a large resistive element that is selectively placed in-line with the current until the precharge is completed. Self-discharger 780 includes a dual-use of the battery precharger selectively configured to dissipate all energy from all storage elements until the discharge endpoint is reached.

Module Level Resistor

For this mode, self-discharger 780 includes a selectively switchable dissipative element (e.g., a module level resistor) installed at each module 750. When self-discharger 780 is active, these dissipative elements are enabled.

Intentional self-discharge as described in the context of FIG. 7 may be established by monitoring one or more of the potential triggers for the battery pack to enter the intentional self-discharge state. These triggers could include: a digital or CAN signal from an inertial sensor indicating the vehicle has been in a crash or a CAN signal request from an external service tool. One could also monitor a CAN signal status bit from the pack indicating that it is in this special self-discharge state. Another metric would be to measure the rate of self-discharge, since the pack will self-discharge much more slowly during normal operation than when the special self-discharge state is enabled, preferably within the intentional self-discharge range of 5-50 W.

Intentional self-discharge is distinguished from inherent self-discharge include a couple of key differences: 1) intentional self-discharge may have a rate that is variable and controlled by one or more controllers, 2) as described herein, the intentional self-discharge state can be enabled/disabled both internal and external to the battery pack, and 3) the self-discharge state can be auto-terminated by a pre-defined voltage limit (greater than zero) or a thermal limit.

While examples and implementations have been described, they should not serve to limit any aspect of the present invention. Accordingly, implementations of the invention can be implemented in digital electronic circuitry, or in computer hardware, firmware, software, or in combinations thereof. Apparatus of the invention can be implemented in a computer program product tangibly embodied in a machine readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read only memory and/or a random access memory. Generally, a computer will include one or more mass storage devices for storing data files; such devices include magnetic disks, such as internal hard disks and removable disks; magneto optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto optical disks; and CD ROM disks. Any of the foregoing can be supplemented by, or incorporated in, ASICs.

The system and methods above has been described in general terms as an aid to understanding details of preferred embodiments of the present invention. In the description herein, numerous specific details are provided, such as examples of components and/or methods, to provide a thorough understanding of embodiments of the present invention. Some features and benefits of the present invention are realized in such modes and are not required in every case. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. A self-dischargeable rechargeable high-voltage battery pack, comprising:
 a plurality of series-coupled energy storage elements;
 a housing enclosing and sealing said plurality of series-coupled energy storage elements with a plurality of exterior walls;
 an operational port coupled to a portion of a first particular one exterior wall of said plurality of exterior walls, said operational port providing an energy transfer with respect to said plurality of series-coupled energy storage elements;
 a self-discharger, responsive to a self-discharge signal, initiating an internal dissipation of energy at an intentional self-discharge rate of at least 5 W from said plurality of series-coupled energy storage elements while said self-discharge signal is asserted without said energy transfer through said operational port, wherein said internal dissipation of energy is disabled when said self-discharge signal is not asserted; and
 a battery precharger mechanism coupled to said plurality of series-coupled energy storage elements selectively limiting a current flow from said plurality of series-coupled energy storage elements in a first mode wherein said self-discharger includes said battery precharger mechanism in a second mode that constantly dissipates energy from all said series-coupled energy storage elements at once.

2. The self-dischargeable rechargeable high-voltage battery pack of claim 1 further comprising a motion sensor detecting an acceleration profile associated with a collision event wherein said self-discharge signal is asserted automatically in response to said collision event.

3. The self-dischargeable rechargeable high-voltage battery pack of claim 1 further comprising a battery management system disposed within said housing and coupled to said self-discharger, said battery management system asserting said self-discharge signal until a discharge endpoint is reached wherein said battery management system stops asserting said self-discharge signal.

4. The self-dischargeable rechargeable high-voltage battery pack of claim 2 further comprising a battery management system disposed within said housing and coupled to said self-discharger and to said motion sensor, said battery management system asserting said self-discharge signal in response to said collision event until a discharge endpoint is reached wherein said battery management system stops asserting said self-discharge signal.

5. The self-dischargeable rechargeable high-voltage battery pack of claim 1 further comprising a battery balancing mechanism coupled to said plurality of series-coupled energy storage elements selectively individually balancing a voltage of said plurality of series-coupled energy storage elements in a third mode wherein said self-discharger includes said battery balancing mechanism in said second mode that constantly dissipates energy from all said series-coupled energy storage elements at once.

6. The self-dischargeable rechargeable high-voltage battery pack of claim 1 further comprising an operating environment including an electric motor coupled to said operational port, said electric motor operable by said energy transfer from said plurality of series-coupled energy storage elements.

7. The self-dischargeable rechargeable high-voltage battery pack of claim 6 wherein said operational port includes a power connector and a communications interface and wherein said operating environment provides said self-discharge signal through said communications interface.

8. The self-dischargeable rechargeable high-voltage battery pack of claim 1 wherein said internal dissipation of energy from the plurality of series-coupled energy storage elements occurs at a self-discharge rate of 5-50 W.

9. The self-dischargeable rechargeable high-voltage battery pack of claim 1 further comprising a processing system coupled to said pluralities of series-coupled energy storage elements, said processing system including a power conserving operating mode reducing an internal power dissipation of said pluralities of series-coupled energy storage elements wherein said self-discharger selectively actuates, in response to said self-discharge signal, a power consuming operating mode for said pluralities of series-coupled energy storage elements that disables said power conserving operating mode and wherein said self-discharger enables said power conserving operating mode when said self-discharge signal is not enabled.

10. The self-dischargeable rechargeable high-voltage battery pack of claim 1 wherein said operational port includes a power connector and a communications interface and further comprising a service unit separate from a battery management system, the service unit coupled to said operational port and asserting said self-discharge signal through said communications interface.

11. A self-dischargeable rechargeable high-voltage battery pack, comprising:
a plurality of battery modules serially coupled to each other;
inside each of the plurality of battery modules, a plurality of series-coupled energy storage elements;
a housing enclosing and sealing said plurality of battery modules with a plurality of exterior walls;
an operational port coupled to a portion of a first particular one exterior wall of said plurality of exterior walls, said operational port providing an energy transfer with respect to said pluralities of series-coupled energy storage elements;
a self-discharger, responsive to a self-discharge signal, initiating an internal dissipation of energy at an intentional self-discharge rate of at least 5 W from said pluralities of series-coupled energy storage elements while said self-discharge signal is asserted without said energy transfer through said operational port, wherein said internal dissipation of energy is disabled when said self-discharge signal is not asserted; and
a plurality of energy dissipative elements selectively functionally coupled to said pluralities of series-coupled energy storage elements, wherein each of the plurality of energy dissipative elements is installed at a respective one of the plurality of battery modules, wherein said self-discharger selectively enables said energy dissipative elements to dissipate energy from said pluralities of series-coupled energy storage elements in response to said assertion of said self-discharge signal, said plurality of energy dissipative elements not dissipating energy from said plurality of series-coupled energy storage elements when said self-discharge signal is not asserted.

12. The self-dischargeable rechargeable high-voltage battery pack of claim 11 further comprising a processing system coupled to said pluralities of series-coupled energy storage elements, said processing system including a power conserving operating mode reducing an internal power dissipation of said pluralities of series-coupled energy storage elements wherein said self-discharger selectively actuates, in response to said self-discharge signal, a power consuming operating mode for said pluralities of series-coupled energy storage elements that disables said power conserving operating mode and wherein said self-discharger enables said power conserving operating mode when said self-discharge signal is not enabled.

13. The self-dischargeable rechargeable high-voltage battery pack of claim 11, wherein said operational port includes a power connector and a communications interface and further comprising a service unit separate from a battery management system, the service unit coupled to said operational port and asserting said self-discharge signal through said communications interface.

14. A computer-implemented method for managing a self-dischargeable rechargeable high-voltage battery pack, comprising:
a) configuring the self-dischargeable rechargeable high-voltage battery pack for an energy transfer between the self-dischargeable rechargeable high-voltage battery pack and an exterior operational port, the self-dischargeable rechargeable high-voltage battery pack including a plurality of battery modules serially coupled to each other, and, inside each of the plurality of battery modules, a plurality of series-coupled energy storage elements; and b) self-discharging the self-dischargeable rechargeable high-voltage battery pack at an intentional self-discharge rate of at least 5 W using a processor in response to an assertion of a self-discharge signal, and using a plurality of energy dissipative elements selectively functionally coupled to said pluralities of series-coupled energy storage elements, wherein each of the plurality of energy dissipative elements is installed at a respective one of the plurality of battery modules, the self-dischargeable rechargeable high-voltage battery pack not self-discharging absent said assertion and not self-discharging using said energy transfer.

15. The computer-implemented method of claim 14 wherein said self-discharging step discharges at a self-discharge rate of 5-50 W.

16. The computer-implemented method of claim 13 further comprising:
c) terminating automatically said self-discharging when a discharge endpoint is reached.

17. The computer-implemented method of claim 14 wherein said exterior operational port includes a power connector and a communications interface, the method further comprising:
c) asserting said self-discharge signal through said communications interface.

18. The computer-implemented method of claim 14 further comprising:
c) detecting a collision event using a motion detector; and thereafter
d) asserting automatically said self-discharge signal.

19. The computer-implemented method of claim 14, wherein the self-dischargeable rechargeable high-voltage battery pack includes a processing system coupled to said pluralities of series-coupled energy storage elements, said processing system including a power conserving operating mode reducing an internal power dissipation of said pluralities of series-coupled energy storage elements, the method further comprising actuating a power consuming operating mode for said pluralities of series-coupled energy storage elements that disables said power conserving operating mode, and enabling said power conserving operating mode when said self-discharge signal is not asserted.

20. The computer-implemented method of claim 14, wherein the self-dischargeable rechargeable high-voltage battery pack includes a power connector and a communications interface, and wherein the self-discharge signal is asserted using a service unit separate from a battery management system, the service unit coupled to said exterior operational port and asserting said self-discharge signal through said communications interface.

* * * * *